(12) United States Patent
Hsu et al.

(10) Patent No.: US 7,875,547 B2
(45) Date of Patent: Jan. 25, 2011

(54) CONTACT HOLE STRUCTURES AND CONTACT STRUCTURES AND FABRICATION METHODS THEREOF

(75) Inventors: Ju-Wang Hsu, Taipei (TW); Jyu-Horng Shieh, Hsin-Chu (TW); Yi-Nien Su, Kaohsiung (TW); Peng-Fu Hsu, Hsinchu (TW); Hun-Jan Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 585 days.

(21) Appl. No.: 11/035,325

(22) Filed: Jan. 12, 2005

(65) Prior Publication Data

US 2006/0154478 A1 Jul. 13, 2006

(51) Int. Cl.
*H01L 21/4763* (2006.01)
(52) U.S. Cl. .................. 438/622; 438/623; 438/626
(58) Field of Classification Search .......... 438/622, 438/623, 626
See application file for complete search history.

(56) References Cited

U.S. PATENT DOCUMENTS

| | | | |
|---|---|---|---|
| 5,216,281 A | 6/1993 | Butler | |
| 5,885,865 A | 3/1999 | Liang et al. | |
| 6,127,260 A | 10/2000 | Huang | |
| 6,274,391 B1 * | 8/2001 | Wachtler et al. | 438/6 |
| 6,287,951 B1 * | 9/2001 | Lucas et al. | 438/618 |
| 6,420,226 B1 | 7/2002 | Chen et al. | |
| 6,455,406 B1 | 9/2002 | Linderer et al. | |
| 6,458,710 B1 | 10/2002 | Burke | |
| 6,461,955 B1 | 10/2002 | Tsu et al. | |
| 6,489,227 B1 | 12/2002 | Hsieh et al. | |
| 6,900,494 B2 * | 5/2005 | Abbott et al. | 257/297 |
| 6,939,794 B2 * | 9/2005 | Yin et al. | 438/624 |
| 2002/0048931 A1 * | 4/2002 | Farrar | 438/622 |
| 2002/0058411 A1 * | 5/2002 | Hasegawa et al. | 438/653 |
| 2002/0115310 A1 * | 8/2002 | Ueda | 438/945 |
| 2002/0130417 A1 * | 9/2002 | Yew et al. | 257/758 |
| 2003/0193090 A1 * | 10/2003 | Otani et al. | 257/758 |
| 2004/0004287 A1 * | 1/2004 | Shimizu et al. | 257/758 |
| 2004/0041267 A1 * | 3/2004 | Kakamu et al. | 257/758 |
| 2004/0058517 A1 | 3/2004 | Nallan et al. | |
| 2004/0084775 A1 * | 5/2004 | Sugino et al. | 257/758 |
| 2004/0164418 A1 * | 8/2004 | Sugiura et al. | 257/758 |
| 2004/0198062 A1 | 10/2004 | Ye et al. | |
| 2005/0035460 A1 * | 2/2005 | Tseng | 257/760 |
| 2006/0019488 A1 * | 1/2006 | Liaw | 438/637 |
| 2006/0216926 A1 * | 9/2006 | Ye et al. | 438/629 |

FOREIGN PATENT DOCUMENTS

JP P2000-58538 * 2/2000

* cited by examiner

*Primary Examiner*—Matthew C Landau
*Assistant Examiner*—James M Mitchell
(74) *Attorney, Agent, or Firm*—Duane Morris LLP

(57) ABSTRACT

Methods and structures for forming a contact hole structure are disclosed. These methods first form a substantially silicon-free material layer over a substrate. A material layer is formed over the substantially silicon-free material layer. A contact hole is formed within the substantially silicon-free material layer and the material layer without substantially damaging the substrate. In addition, a conductive layer is formed in the contact hole so as to form a contact structure.

14 Claims, 19 Drawing Sheets

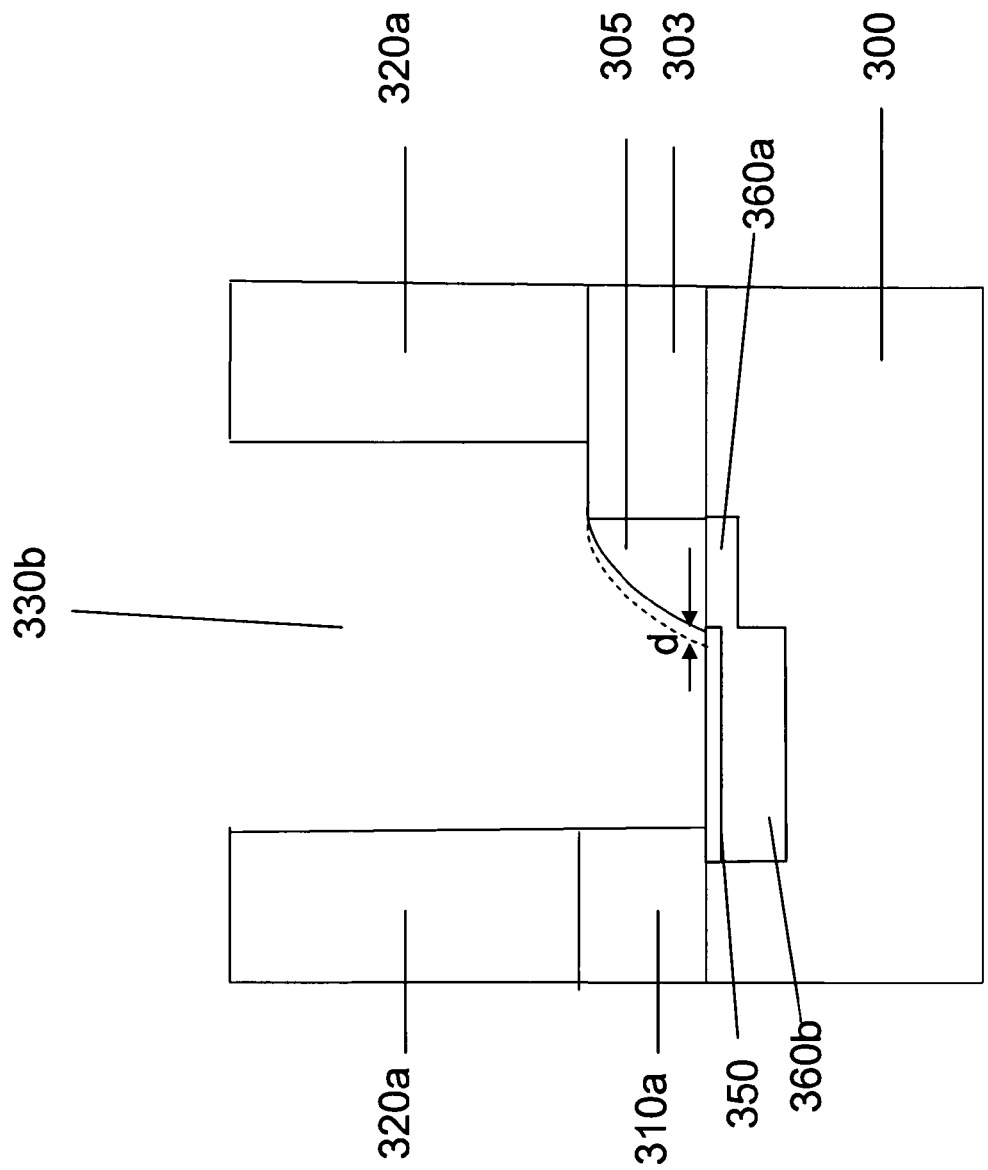

CONTACT HOLE STRUCTURES AND CONTACT STRUCTURES AND FABRICATION METHODS THEREOF

FIELD OF THE INVENTION

The present invention relates to the fabrication of integrated circuit devices on semiconductor substrates and, more particularly relates to contact hole structures, contact structures and fabrication methods thereof.

BACKGROUND OF THE INVENTION

The Complementary Metal Oxide Semiconductor (CMOS) technology has been recognized as the leading technology for use in digital electronics in general and for use in many computer products in particular. The miniaturization of CMOS technology according to a scaling rule is used in a semiconductor device to achieve large-scale integration and high-speed operation. Due to the miniaturization of CMOS devices, formation of a contact hole structure with a tight design rule becomes a challenge for manufacturing semiconductor circuits.

FIGS. 1A and 1B are schematic cross sectional drawings showing a prior art method for forming a contact hole structure at an area near to a polycrystalline silicon ("poly") gate.

Referring to FIG. 1A, a gate 103 and a spacer 105 are formed on a substrate 100. A first dielectric layer 110 is formed over the substrate 100, covering the gate 103 and the spacer 105. An etch stop layer 115 is formed over the first dielectric layer 110. A second dielectric layer 120 is formed over the etch stop layer 115. A patterned mask layer 140 is formed over the second dielectric layer 120, having an opening 130 formed therein.

By using the patterned mask layer 140 as an etch mask, an etch process removes portions of the second dielectric layer 120, the etch stop layer 115 and the first dielectric layer 110 so as to form the contact hole 130a, the second dielectric layer 120a, the etch stop layer 115a and the first dielectric layer 110a shown in FIG. 1B. In the prior art method, the spacer 105 also serves as an etch stop layer by the reason of the tight design rule. Due to the etch process, a portion of the spacer 105 and a portion of source/drain (S/D) salicidation region 150 on the substrate 100 are removed. A recess 130b is formed at the bottom of the contact hole 130a, extending into the S/D salicidation region 150. Due to the lateral width loss d of the spacer 105, the lightly doped drain (LDD) 160a is damaged in the etch process. The source/drain (S/D) region 160b is damaged, too. That is, a substantial amount of material is removed from the LDD region 160a and the S/D region 160b, and the thickness of the regions 160a and 160b is reduced. Without salicidation on the surface of the LDD 160a, the damage at the LDD 160a creates greater leakage currents than that at the S/D salicidation region 150. The leakage currents increase power consumption of the circuits with such a contact structure and cause failure of the circuits.

U.S. Pat. No. 6,489,227 (Hsieh) shows a method for making low-topography buried capacitor by a two stage etching process. The method first deposits oxide layers, and then forms a small pre-contact hole by a dry etch method. A wet etch method forms a large contact hole while using silicon nitride caps and sidewall spacers previously deposited on the word lines and on the bit lines as etch stop layers. A buried capacitor that has significantly improved topography can be fabricated in a semiconductor device.

U.S. Patent Publication No. 2002/0137355 (GB) relates to a process for forming uniform multiple contact holes. The process features a series of isotropic and anisotropic, dry etch procedures, used to define an initial contact hole opening in the insulator layer, and in the top portion of the conductive region. The isotropic dry etch procedure results in a tapered contact hole profile for top portion of the initial contact hole opening, while subsequent anisotropic dry etch procedures create a straight walled contact hole profile for the bottom portion of the initial contact hole opening. After removal of the contact hole defining, photoresist shape, a wet etch procedure is used to laterally recess the insulator layer exposed in the initial contact hole opening creating the final, uniform contact hole opening.

U.S. Pat. No. 5,216,281 (Butler) is directed to a contact structure incorporating a dopant source. A layer of a transition metal nitride, such as titanium nitride (TiN), is formed over the transistor source, gate electrode, and drain regions. A blanket layer of titanium nitride is formed which covers the top and sides of the dielectric insulated gate electrode, and the bottom and side walls of the openings for the source and drain regions. Where field shield isolation is provided, the nitride layer also covers the top surface of the field shield isolation transistors.

None of these patents address forming a contact hole structure without substantially damaging the substrate.

SUMMARY OF THE INVENTION

An exemplary method for forming a contact hole structure is disclosed. The method comprises first forming a substantially silicon-free material layer over a substrate. A material layer is formed over the substantially silicon-free material layer. A contact hole structure is formed within the substantially silicon-free material layer and the material layer substantially without damaging the substrate.

An exemplary method for forming a contact structure is also disclosed. According to the contact hole structure described above, a conductive layer is formed in the contact hole so as to form a contact structure.

An exemplary method for forming a contact hole structure is disclosed. The method first forms a first material layer over a substrate. A second material layer is formed over the first material layer. A contact hole structure is formed within the first material layer and the second material layer by a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of the dry etch process and the wet etch process.

An exemplary method for forming a contact structure is also disclosed. According to the contact hole structure described above, a conductive layer is formed in the contact hole so as to form a contact structure.

An exemplary method for forming a contact hole structure is disclosed. The method first provides a substrate having a gate and a spacer thereon. A substantially silicon-free material layer is formed on the spacer. A material layer is formed over the substantially silicon-free material layer, the gate and the spacer. A contact hole structure is formed on or adjacent to the spacer within the first material layer and the second material layer by a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of the dry etch process and the wet etch process.

A contact hole structure is provided. The contact hole structure comprises: a substrate, a substantially silicon-free material layer, a material layer and a contact hole. The substantially silicon-free material layer is over the substrate. The material layer is over the substantially silicon-free material layer. The contact hole structure is within the substantially silicon-free layer and the material layer, without substantially damaging the substrate.

A contact structure is also disclosed. In addition to the contact hole structure described above, a conductive layer is formed in the contact hole so as to form a contact structure.

Another contact hole structure is also disclosed. The contact hole structure comprises: a substrate, a substantially silicon-free material layer, a material layer and a contact hole. The substrate has a gate and a spacer thereon. The substantially silicon-free material layer is on the spacer. The material layer is over the substantially silicon-free material layer, the gate and the spacer. The contact hole is within the substantially silicon-free layer and the material layer. The substantially silicon-free material layer and the material layer have different etch rates in response with an etch process which comprises a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of the dry etch process and the wet etch process.

A contact structure is also disclosed. In addition to the contact hole structure described above, a conductive layer is formed in the contact hole so as to form a contact structure.

The above and other features of the present invention will be better understood from the following detailed description of the preferred embodiments of the invention that is provided in connection with the accompanying drawings.

BRIEF DESCRIPTION OF THE DRAWINGS

FIGS. 3A-3C are schematic cross sectional drawings showing exemplary progression of steps of forming a contact hole structure on a topographic structure.

DETAILED DESCRIPTION OF THE INVENTION

Figure 1A:
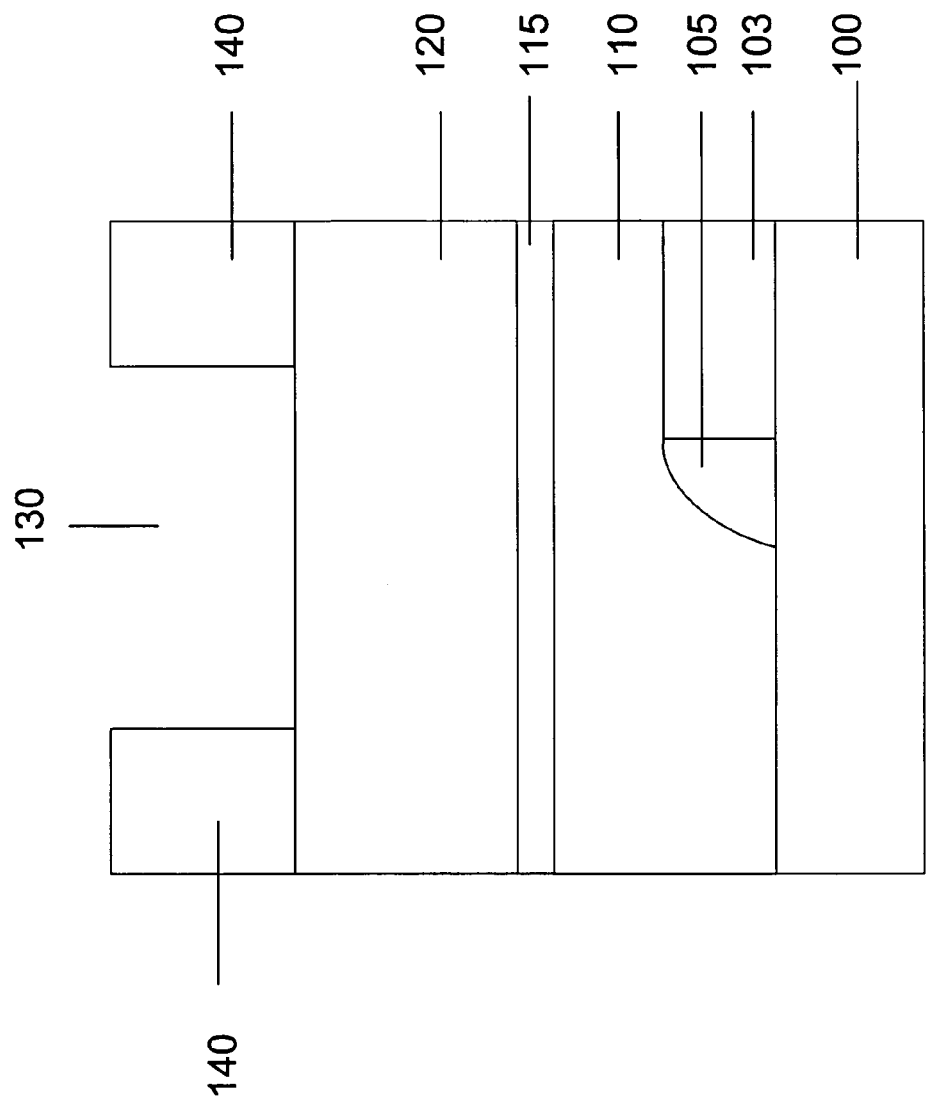
FIGS. 1A and 1B are schematic cross sectional drawings showing a prior art method for forming a contact hole structure at an area near to a poly gate.
Figure 1B:
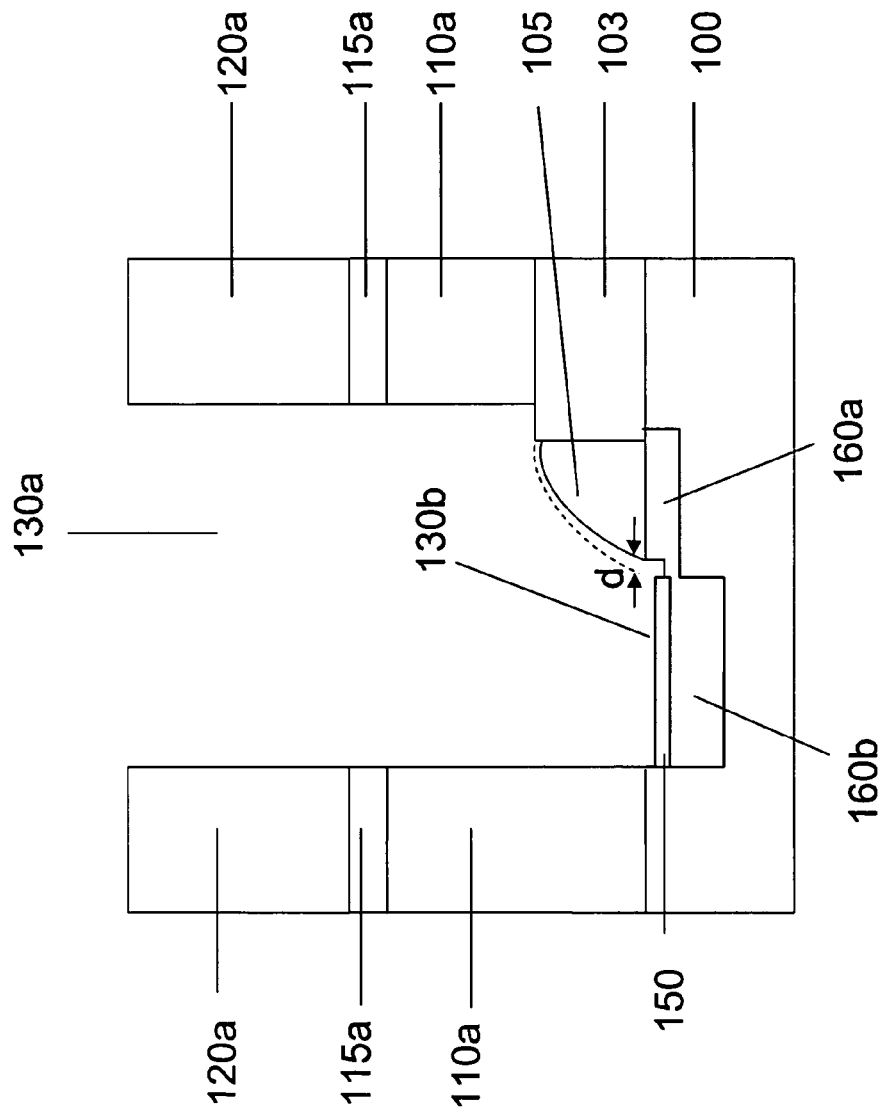
Figure 2A:
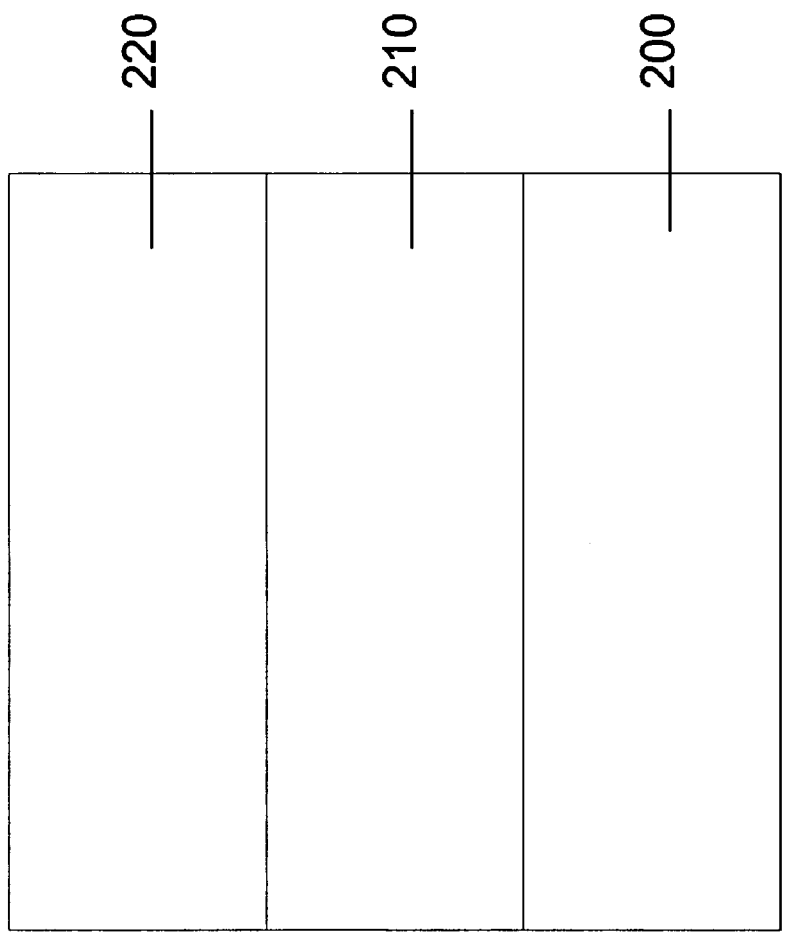
FIGS. 2A and 2B are schematic cross sectional drawings showing an exemplary method for forming a contact hole structure.
Figure 2B:
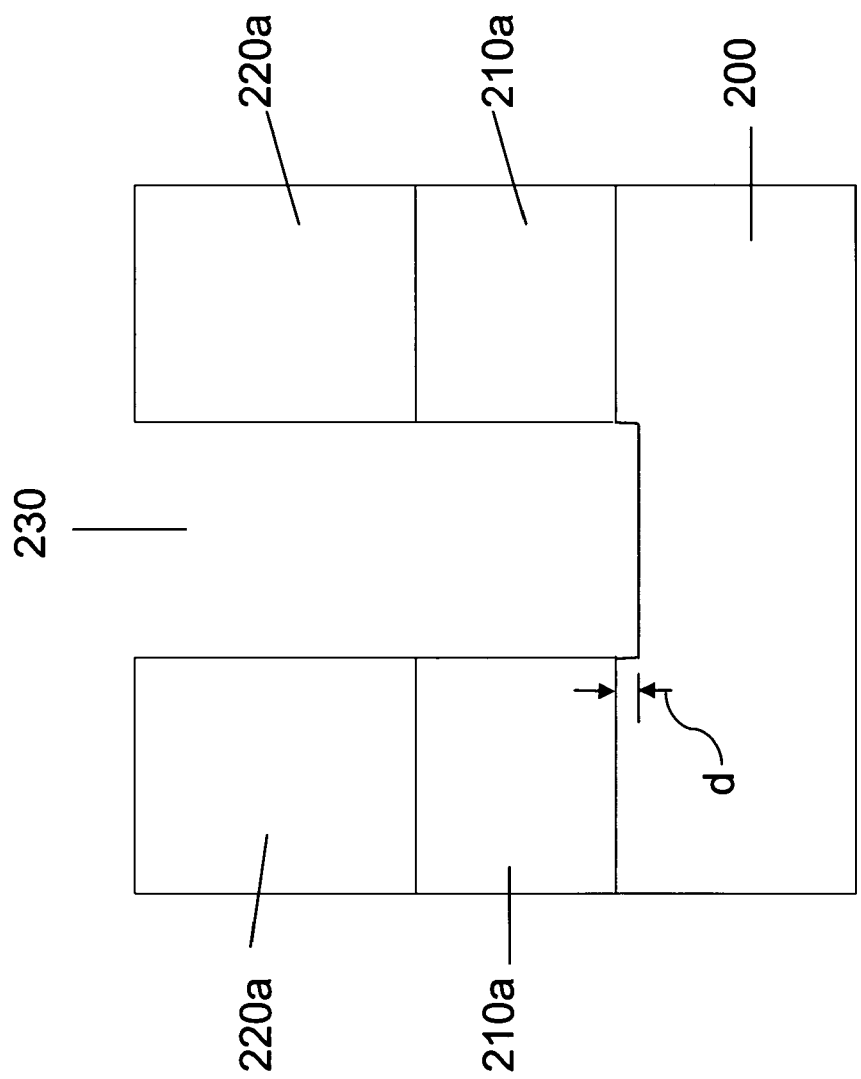

FIGS. 2A and 2B are schematic cross sectional drawings showing an exemplary method for forming a contact hole structure.

The structure shown in FIG. 2A comprises a substrate 200, a substantially silicon-free material layer 210 over the substrate 200 and a material layer 220 over the substantially silicon-free material layer 210.

The substrate 200 can be, for example, a silicon substrate, a III-V compound substrate, a glass substrate, or any other substrate similar thereto. The substantially silicon-free material layer 210 can be a material such as SiLK or an amorphous carbon low-k material sold by Applied Materials of Santa Clara, Calif. under the trademark, "APF", and can be formed by, for example, chemical vapor deposition (CVD) or spin coating. In some embodiments, the substantially silicon-free material layer 210 is also substantially oxygen-free. The substantially silicon-free material layer 210 may comprise no more than about 6% oxygen. The material layer 220 comprises dielectric layers and anti-reflection coating layers. The dielectric layer can be, for example, an undoped silicate glass (USG) layer, a boron doped silicate glass (BSG) layer, a phosphorous doped silicate glass (PSG) layer, a boron phosphorous doped silicate glass (BPSG) layer, a silicon nitride layer, a silicon oxy-nitride layer, a fluorine doped silicate glass (FSG) layer, a low-k dielectric layer or a combination thereof. The material layer 220 can be formed, for example, by CVD, or spin-on coating.

Referring to FIG. 2B, a contact hole 230 is formed by removing portions of the substantially silicon-free layer 210 and the material layer 220 without substantially damaging the substrate 200. A patterned photoresist layer (not shown) is usually formed by a photolithographic process on the material layer 220. By using the patterned photoresist layer as an etch mask, one or more etch processes are applied to remove portions of the substantially silicon-free layer 210 and the material layer 220. The step of removing the portion of the material layer 220 so as to form the material layer 220a can be, for example, by a dry etch process with a reaction gas such as $CF_4$ or $C_4F_8$. In this embodiment, the step of removing the portion of the substantially silicon-free material layer 210 so as to form the substantially silicon-free material layer 210a can be, for example, a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of the dry etch process and the wet etch process. Due to the substantially silicon-free feature of the substantially silicon-free material layer 210a, and the use of the aforementioned etches processes that do not include fluorine, the dry or wet etch process of this embodiment forms the contact hole 230 without substantially damaging the substrate 200. because the etch process etches a silicon-free material layer and dose not substantially etch silicon. In this embodiment, the step of removing the substantially silicon-free material layer 210a without substantially damaging the substrate 200 means that the depth d of the removed substrate 200 is no more than about 200 angstroms. It is known that the acceptable loss of the substrate 200 varies with the semiconductor technology. The more minimized devices are, the less loss the substrate 200 should have. The reduction of the substrate loss also suppresses the leakage current. The concern of the loss of the substrate 200 can be reflected from the amount of the leakage current. An insubstantial amount of material removal from the substrate 200 may be acceptable in some embodiments. As long as the leakage current of the structure falls into the specification thereof, this "insubstantial damage" is acceptable. After reading the descriptions of this embodiment, one of ordinary skill in the art will understand that the leakage current relates to the loss of the substrate 200, and that the leakage current specification varies with devices and integrated circuits. Accordingly, one of ordinary skill in the art will know how to modify the process so as to fabricate a desired structure which will not generate leakage currents out of the specification.

In this embodiment, the step of removing the portion of the material layer 220 substantially stops on the surface of the substantially silicon-free material layer 210. The step of removing the portion of the material layer 220 may be stopped after some of the substantially silicon-free material layer 210 is removed. Then the step of removing the portion of the substantially silicon-free material layer 210 is performed. After viewing the description of this embodiment, one of ordinary skill in the art will understand how to modify these two etch processes on the basis of requirements of processes. In this embodiment, the etch process for removing the portion of the substantially silicon-free material layer 210 have different etch rates for the substantially silicon-free material layer 210 and the material layer 220. Due to the different etch rates, the dry or wet etch process of this embodiment forms the contact hole 230 without substantially damaging the substrate 200.

In some embodiments, the material layer 220 is an anti-reflection coating layer. While removing the portion of the substantially silicon-free material layer 210, the etch process has different etch rates for the substantially silicon-free material layer 210 and the material layer 220. Due to the different etch rates, the dry or wet etch process of this embodiment forms the contact hole 230 without substantially damaging the substrate 200.

Figure 2C:
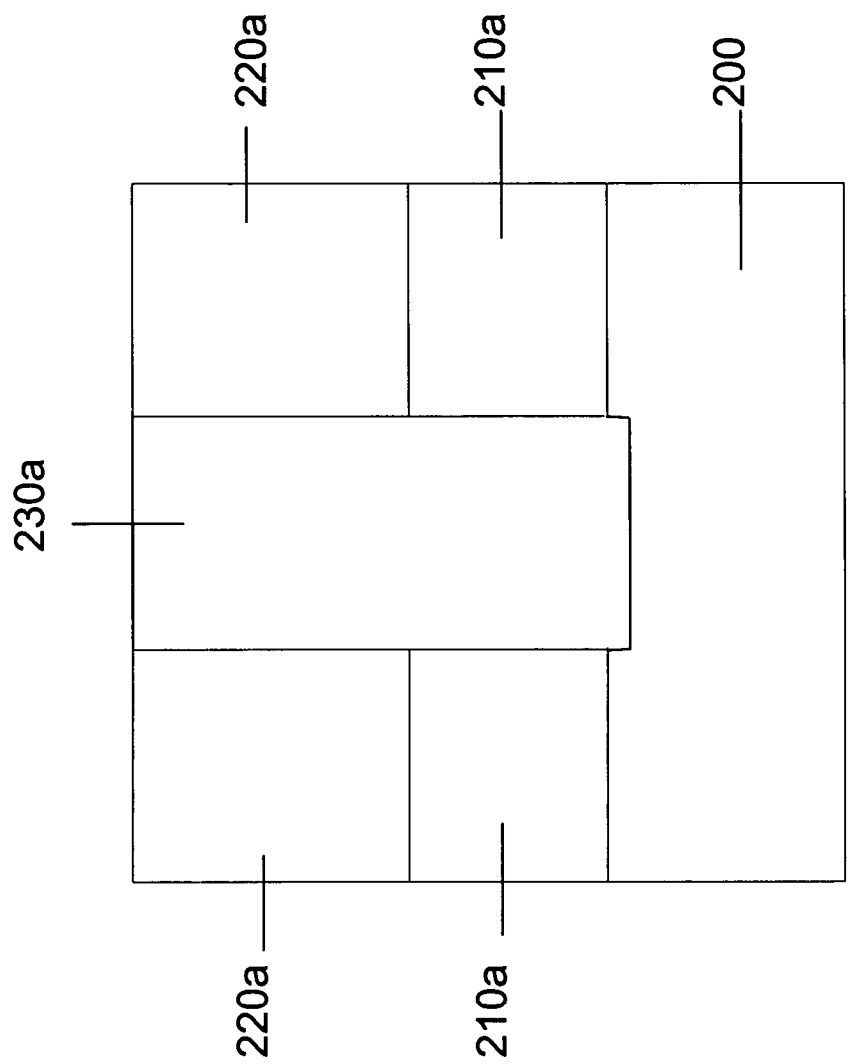
FIG. 2C is a schematic cross sectional view showing an exemplary contact structure.

FIG. 2C is a schematic cross sectional view showing an exemplary contact structure.

A conductive layer 230a is formed in the contact hole 230 of FIG. 2B. The conductive layer 230a can be material such as polysilicon, aluminum, aluminum-copper, tungsten, copper or the like. The conductive layer 230 can be formed, for example, by CVD, physical vapor deposition (PVD), electroplating, electro-less plating or the like. The step of forming the conductive layer 230a may first comprise forming a conductive material (not shown) in the contact hole 230 and over the material layer 220a. Then an etch-back process or a chemical-mechanical polishing (CMP) method is applied to remove the conductive material which is above the material layer 220a so as to form the conductive layer 230a.

Figure 3A:
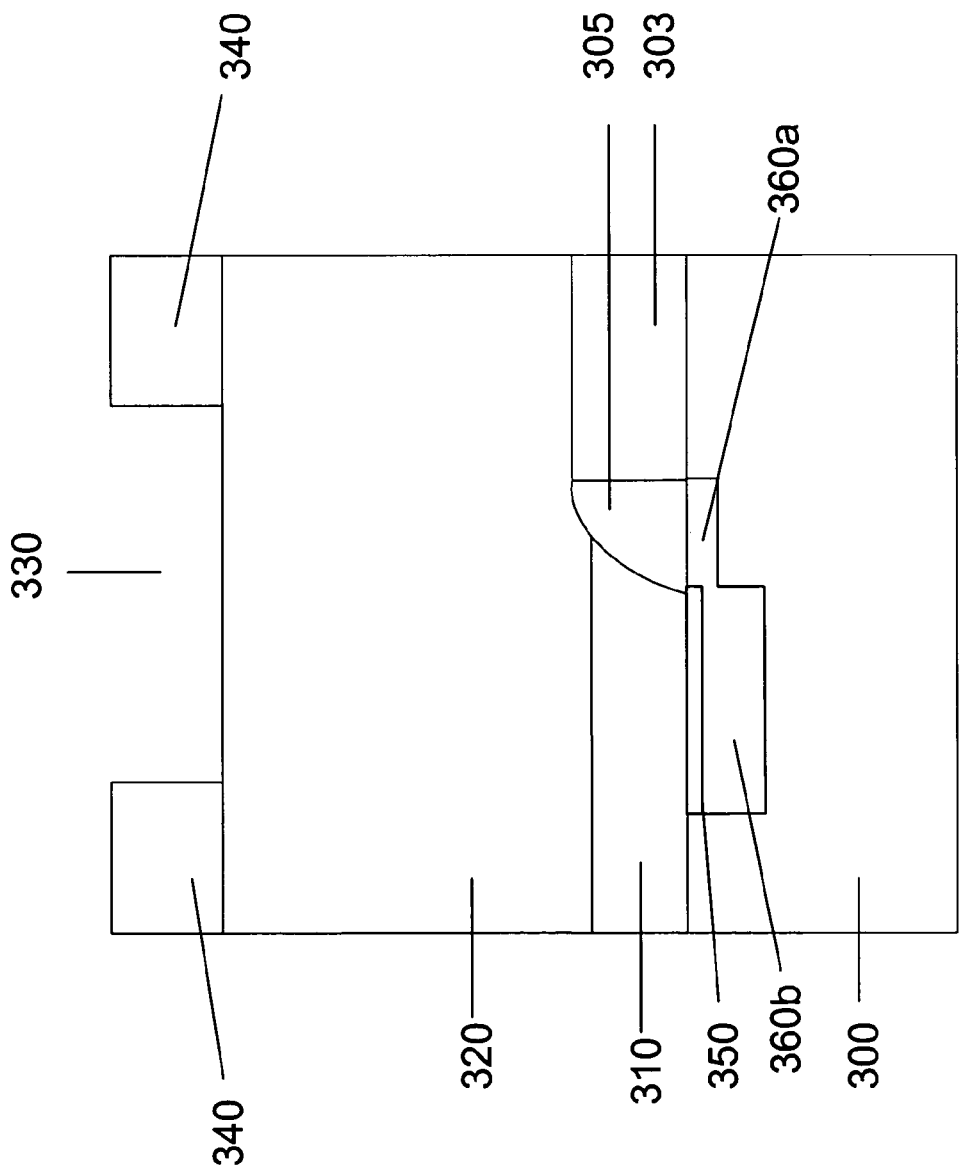
Figure 3B:
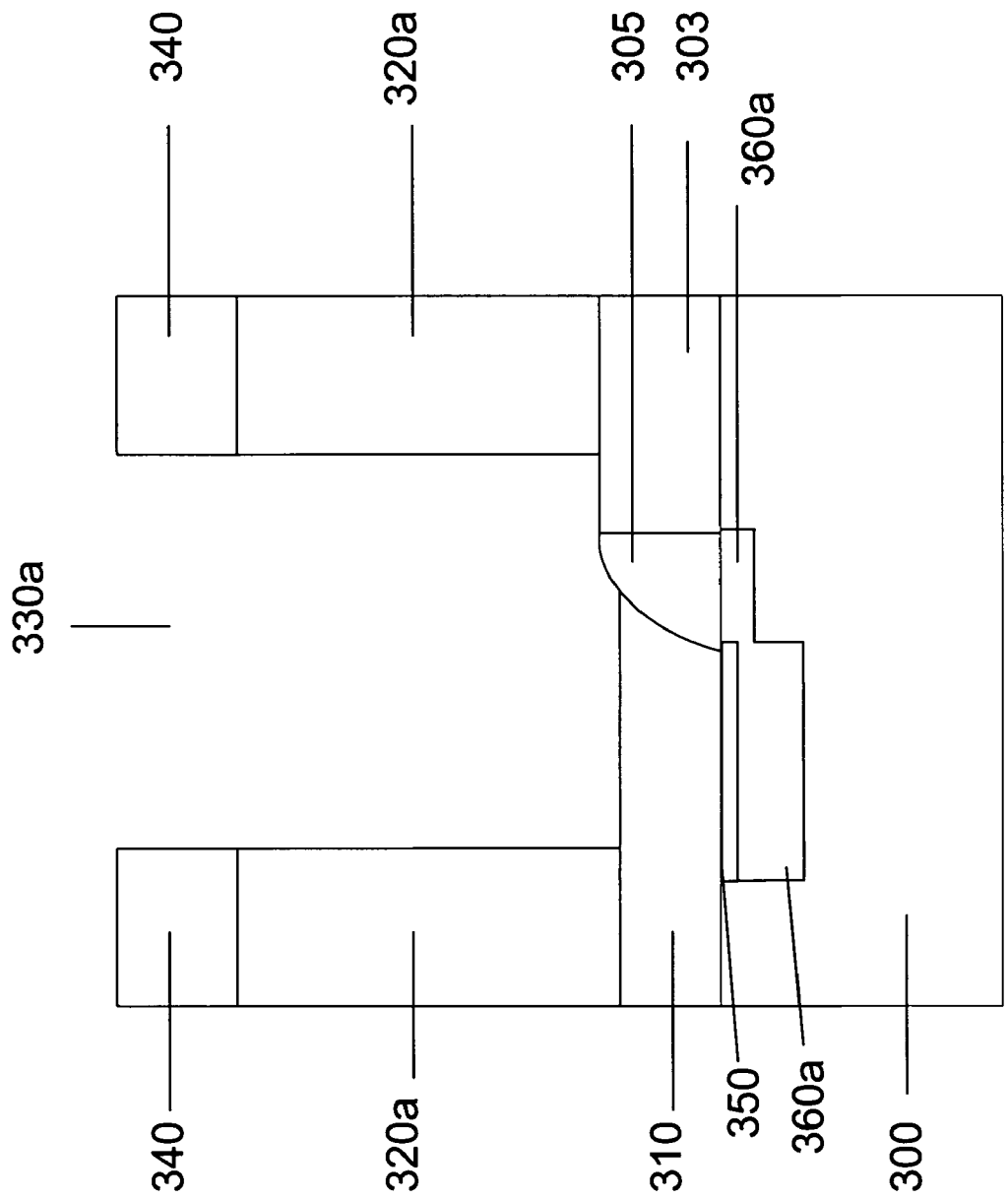

FIGS. 3A-3C are schematic cross sectional drawings showing an exemplary sequence of steps of forming a contact hole structure on a topographic structure.

Referring to FIG. 3A, a topographic structure is formed on a substrate 300. The topographic structure can be, for example, a gate, a spacer or a shallow trench isolation structure. In this embodiment, the topographic structure comprises a gate 303 and a spacer 305. A substantially silicon-free material layer 310 is formed on the spacer 305. A material layer 320 is formed over the substantially silicon-free material layer 310, the spacer 305 and the gate 303. A patterned mask layer 340 is formed over the material layer 320, having an opening 330 therein.

Except for the gate 303, the spacer 305, the patterned mask layer 340 and the opening 330, the source/drain salicidation (S/D) region 350, the lightly doped drain (LDD) region 360a and the S/D region 360b, items of the structure in FIGS. 3A-3C which are the same as items of the structure in FIGS. 2A and 2B are identified by reference numerals that are increased by 100. Detailed descriptions of these items are not repeated. The gate 303 can be, for example, a polysilicon gate or a metal gate. The spacer 305 can be a material such as silicon oxide, silicon nitride or silicon oxy-nitride. The gate 303 and the spacer 305 can be formed by conventional deposition, photolithographic and etch processes. The patterned mask layer 340 can be, for example, a photoresist layer or a dielectric layer, and can be formed by deposition, photolithographic and etch processes. In this embodiment, the substantially silicon-free material layer 310 is formed on at least part of the spacer 305, but does not cover the gate 303. The LDD region 360a and the S/D region 360b can be formed, for example, by ion implantation. The S/D region 350 can be formed, for example, by a salicidation process. The implantation process and the salicidation process are well known to this field. Detailed descriptions are not repeated.

Referring to FIG. 3B, an opening 330a is formed corresponding to the opening 330 of the patterned mask layer 340. The step of removing the portion of the material layer 320 so as to form the material layer 320a is similar to that described above with reference to FIG. 2B. Detailed descriptions are not repeated. The step of removing the portion of the material layer 320 substantially stops on the surface of the substantially silicon-free material layer 310.

Referring to FIG. 3C, a contact hole 330b is formed within the substantially silicon-free material layer 310a and the material layer 320a. The step of removing the portion of the substantially silicon-free material layer 310 so as to form the substantially silicon-free material layer 310a can be, for example, a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of a dry etch process and a wet etch process. Due to the substantially silicon-free feature of the substantially silicon-free material layer 310a, the dry or wet etch process of this embodiment forms the contact hole 330b without substantially damaging the S/D salicidation region 350 and the spacer 305. The insubstantial damage to the spacer 305 means that the loss of the spacer 305 is not serious, so that a substantial portion of the LDD region 360a in the substrate 300 is not exposed and subjected to the dry or wet etch process described above. Without the damage on LDD region 360a, the leakage current resulting therefrom can be substantially curbed. The reduction of the loss of the S/D salicidation region 350 also suppresses the leakage current. The concern of the loss of the S/D salicidation region 350 and the spacer 305 can be reflected from the amount of the leakage current. An insubstantial amount of material removal from the S/D salicidation region 350 and/or spacer 305 may be acceptable in some embodiments. As long as the leakage current of the structure falls into the specification thereof, this "insubstantial damage" is acceptable. In this embodiment, the lateral width loss d of the spacer 305 should not be, for example, more than about 100 angstroms. After reading the descriptions of this embodiment, one of ordinary skill in the art will understand that the leakage current relates to the loss of the S/D salicidation region 350 and the spacer 305, and that the leakage current specification varies with devices and integrated circuits. Accordingly, one of ordinary skill in the art will know how to modify the process so as to fabricate a desired structure which will not generate leakage currents out of the specification.

In this embodiment, the substantially silicon-free material layer 310a does not cover the gate 303. It is not necessarily required that the substantially silicon-free material layer 310a fully cover the topographic structure, i.e. the spacer 305 and the gate 303. As long as the thickness of the substantially silicon-free material layer 310a is sufficient so that the step of removing the portion of the material layer 320 does not damage the substrate 300, the substantially silicon-free material layer 310a may not be required to fully cover the topographic structure, i.e. the gate 303 and the spacer 305. After reading the description of this embodiment, one of ordinary skill in the art will understand how to modify the thickness of the substantially silicon-free material layer 310a in any given situation.

Figure 3D:
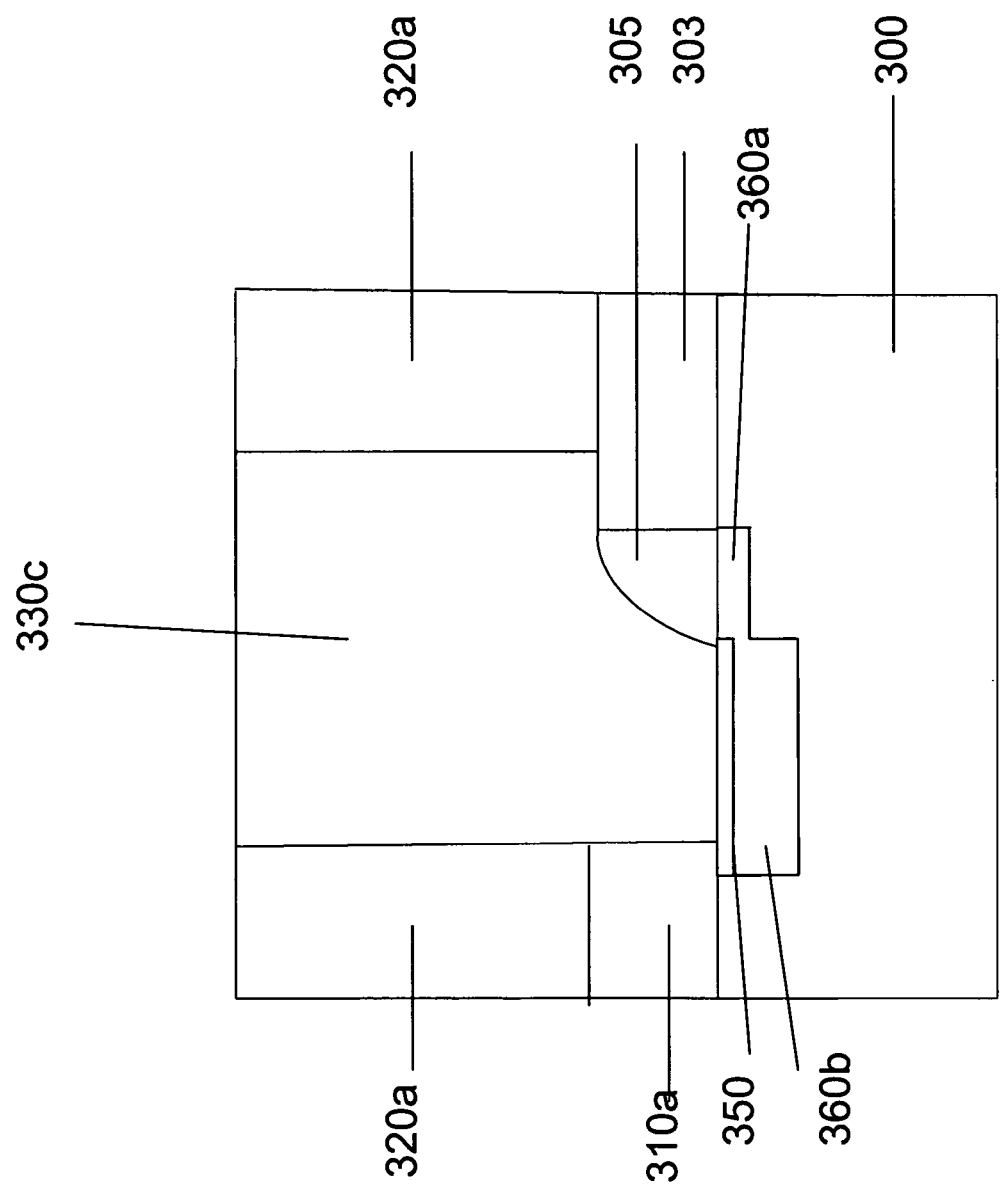
FIG. 3D is a schematic cross sectional view showing an exemplary contact structure.

FIG. 3D is a schematic cross sectional view showing an exemplary contact structure.

A conductive layer 330c is formed in the contact hole 330 of FIG. 3C. The conductive layer 330c is similar to the conductive layer 230a described above with reference to FIG. 2C. Detailed descriptions are not repeated. Referring to FIG. 3D, the conductive layer 330c couples the gate 303 and the substrate 300. By such a coupling, the contact structure shown in FIG. 3D becomes a contact with rectangular or elliptical shape (couple contact or butting contact).

Figure 4A:
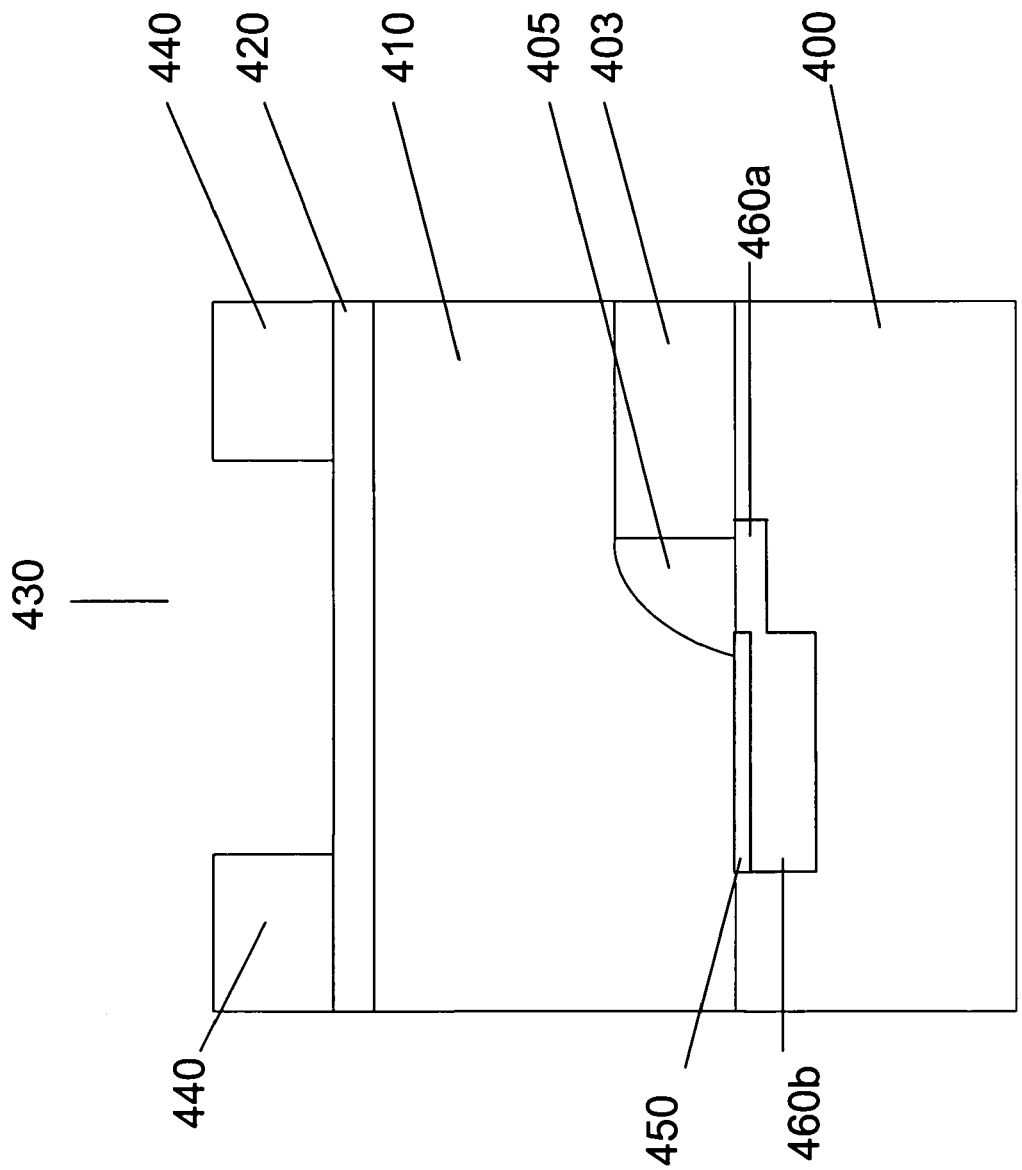
FIGS. 4A-4C are schematic cross sectional drawings showing another exemplary progression of steps of forming a contact hole structure on a topographic structure.
Figure 4B:
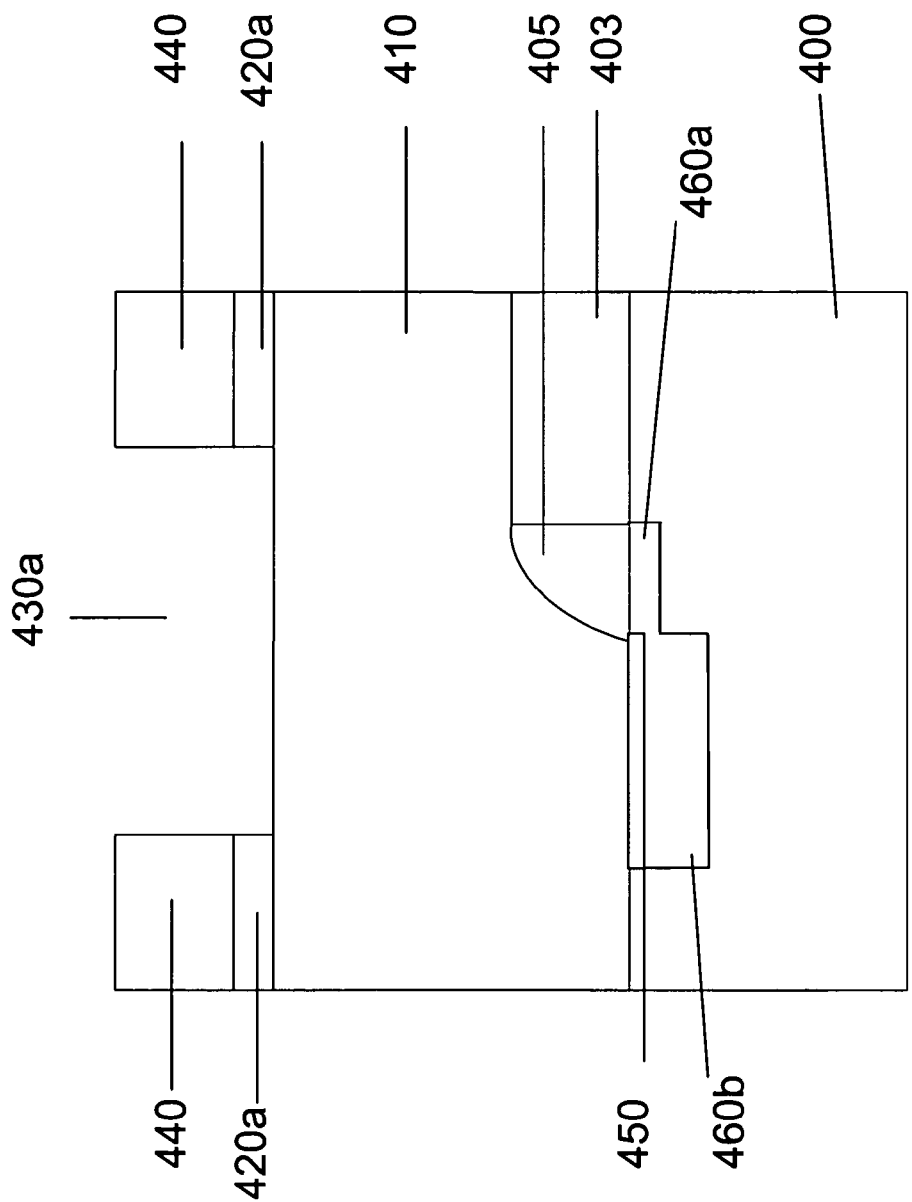
Figure 4C:
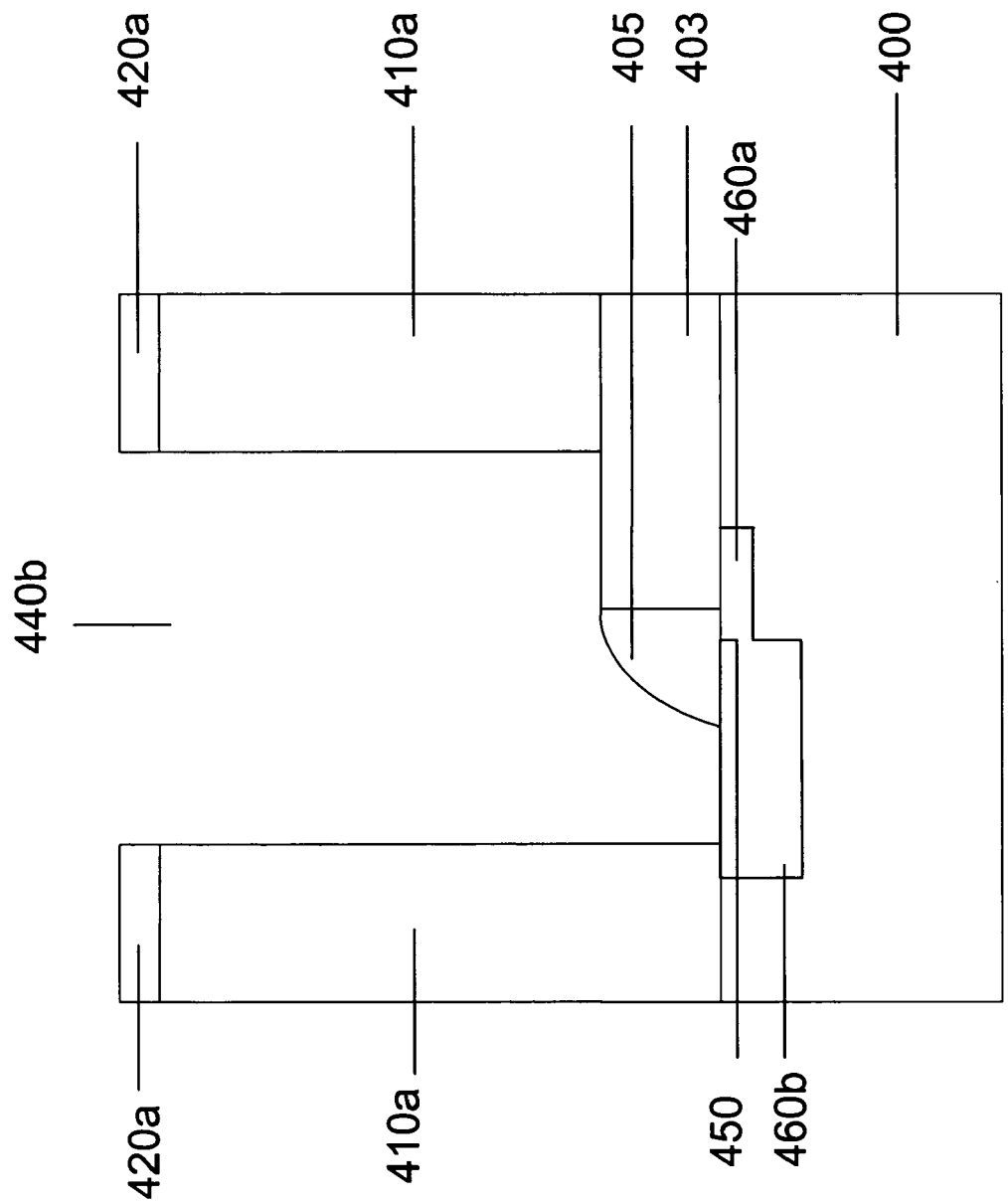

FIGS. 4A-4C are schematic cross sectional drawings showing another exemplary sequence of steps of forming a contact hole structure on a topographic structure.

Referring to FIG. 4A, a topographic structure comprising a gate 403 and a spacer 405 is formed on a substrate 400. A substantially silicon-free material layer 410 is formed, fully covering the gate 403 and the spacer 405. A material layer 420 is formed over the substantially silicon-free material layer 410. A patterned mask layer 440 is formed over the material layer 420, having an opening 430 therein. In this embodiment, the substantially silicon-free material layer 410 substantially planarizes the topographic structure, i.e. the gate 403 and the spacer 405. The LDD region 460a and the S/D region 460b are formed adjacent to the gate 403 in the substrate 400. The S/D salicidation region 450 is formed on the S/D region 460b.

Referring to FIG. 4B, an opening 430a is formed corresponding to the opening 430 of the patterned mask layer 440.

Referring to FIG. 4C, a contact hole 430b is formed within the substantially silicon-free material layer 410a and the material layer 420a.

Items of the structure in FIGS. 4A-4C which are the same as items of the structure in FIGS. 3A-3C are identified by reference numerals that are increased by 100. Detailed descriptions of these items are not repeated.

Due to the substantially silicon-free material layer 410a covering the gate 403 and the spacer 405, damage on the S/D salicidation region 450 and the spacer 405 resulting from the step of removing the portion of the material layer 420 is not a serious concern in this embodiment. The thickness of the substantially silicon-free material layer 410a depends on requirements of the structure and processes. After viewing the description of this embodiment, one of ordinary skill in the art will understand how to modify the thickness of the substantially silicon-free material layer 410a in any given situation.

Figure 4D:
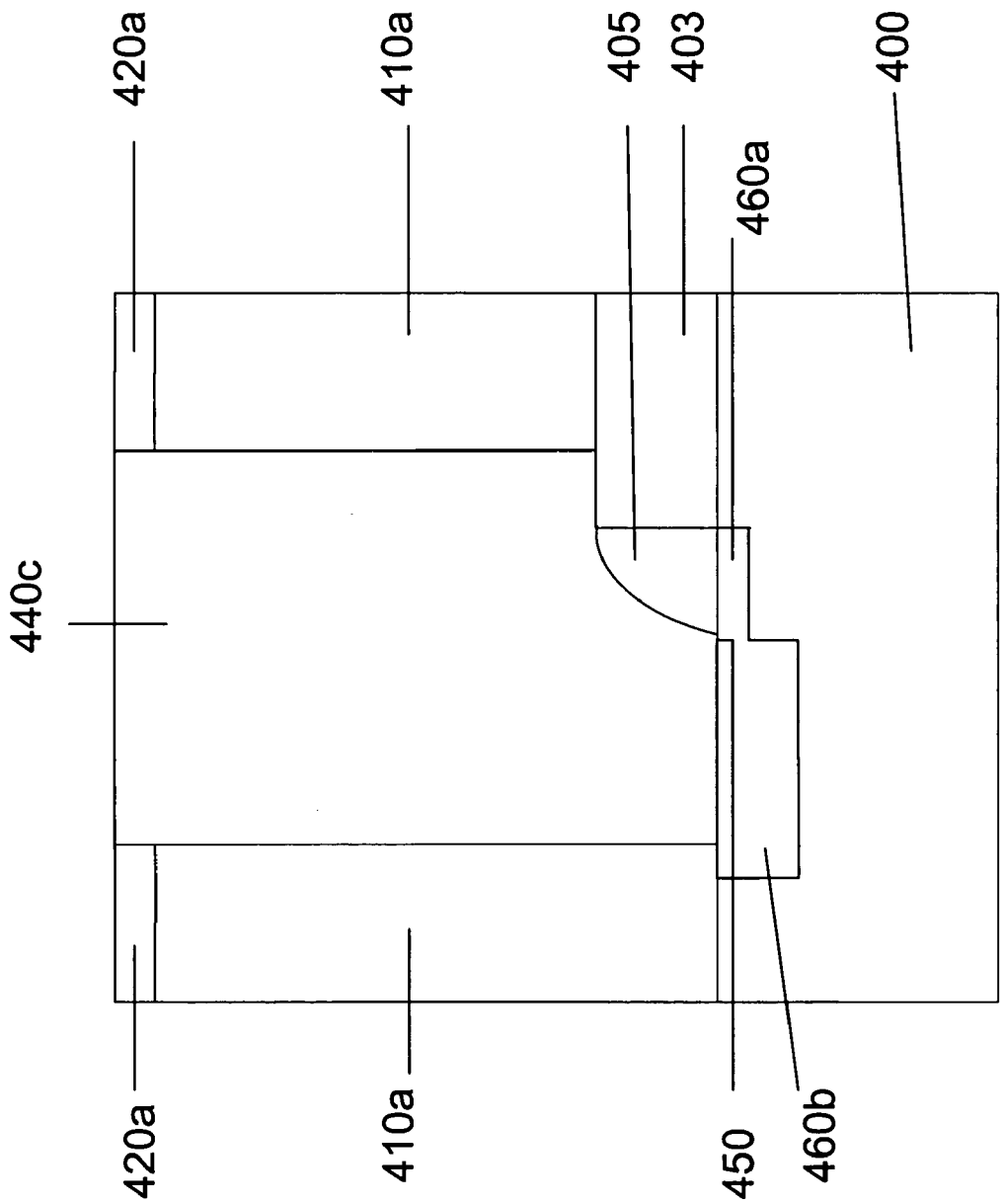
FIG. 4D is a schematic cross sectional view showing an exemplary contact structure.

FIG. 4D is a schematic cross sectional view showing an exemplary contact structure.

A conductive layer 430c is formed in the contact hole 430 of FIG. 4C. The conductive layer 430c is similar to the conductive layer 230a described above with reference to FIG. 2C. Detailed descriptions are not repeated. Referring to FIG. 4D, the conductive layer 430c couples the gate 403 and the substrate 400. By such a coupling, the contact structure shown in FIG. 4D becomes a butting contact.

FIGS. 5A-5F are schematic cross sectional drawings showing a variety of exemplary multi-layer structures before forming a contact hole structure.

Figure 5A:
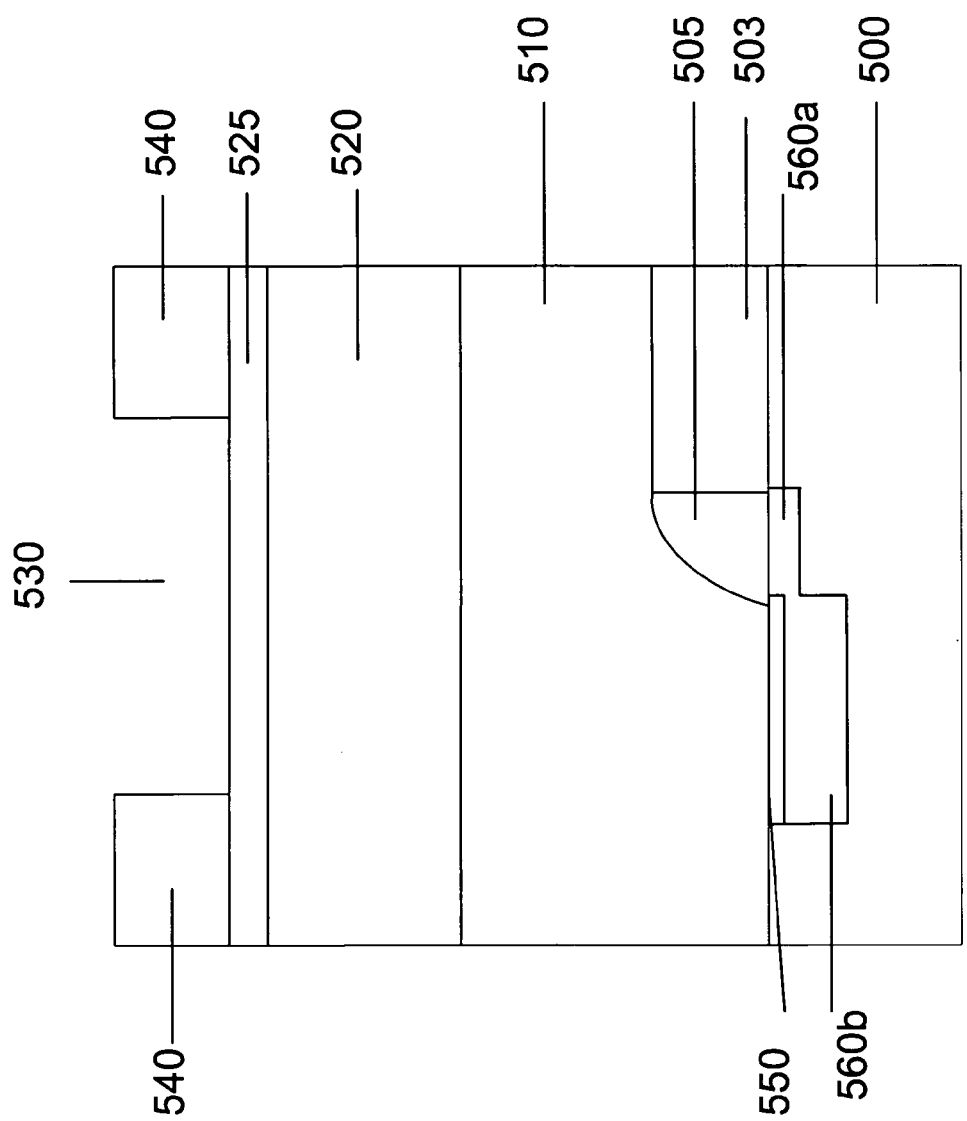
FIGS. 5A-5F are schematic cross sectional drawings showing a variety of exemplary multi-layer structures before forming a contact hole structure.

Except for the dielectric layer 520 and the anti-reflection coating layer 525, items of the structure in FIG. 5A which are the same as items of the structure in FIG. 4A are identified by reference numerals that are increased by 100. Detailed descriptions of these items are not repeated. In this embodiment, the substantially silicon-free material layer 510 fully covers the gate 503 and the spacer 505. The dielectric layer 520 can be, for example, low-k dielectric material, USG, PSG, BSG, BPSG, FSG or the like. The anti-reflection coating layer 525 is formed between the patterned mask layer 540 and the dielectric layer 520. The method of forming a contact hole in this embodiment is similar to that described above with reference to FIGS. 3A-3C. Detailed descriptions are not repeated. Before removing portions of the dielectric layer 520 and the substantially silicon-free material layer 510, the method further comprises removing a portion of the anti-reflection coating layer 525. This exemplary method removes a portion of the anti-reflection coating layer 525 while removing the portion of the dielectric layer 520. In some embodiments, the portion of the anti-reflection coating layer 525 can be removed by a different etch process. After reading the description of this embodiment, one of ordinary skill in the art will understand that the etch process for removing the portion of the anti-reflection coating layer 525 is flexible and modifiable.

Figure 5B:
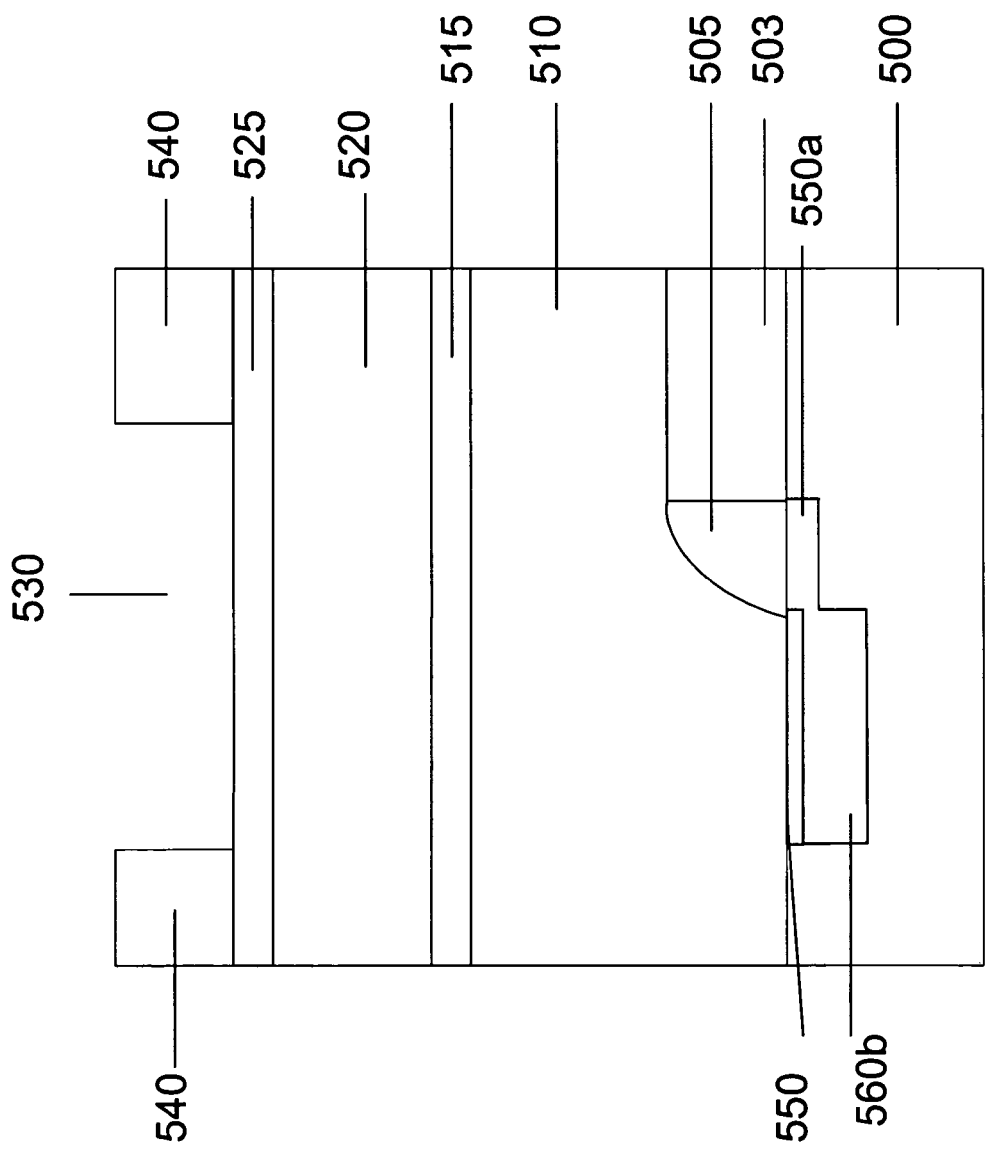

Except for the dielectric layer 515, items of the structure in FIG. 5B which are the same as items of the structure in FIG. 5A are identified by like reference numerals. In this embodiment, the dielectric layer 515 serves as an etch stop layer for removing the portion of the dielectric layer 520. The dielectric layer 515 can be a material such as silicon nitride, silicon oxy-nitride, silicon carbide, silicon oxy-carbide, silicon fluorine, silicon oxy-fluorine and the like. The method of forming the contact hole is similar to that described in FIG. 5A. Detailed descriptions are not repeated. After removing the portion of the dielectric layer 520, the method further comprises removing a portion of the dielectric layer 515. The portion of the dielectric layer 515 can be removed, for example, by a dry etch process with a mixture of $CHF_3$, $CF_4$ and $O_2$. The portion of the dielectric layer 515 may be removed while the dielectric layer 520 is removed. After reading the description of this embodiment, one of ordinary skill in the art will understand that the etch process for removing the portion of the dielectric layer 515 is flexible and modifiable.

Figure 5C:
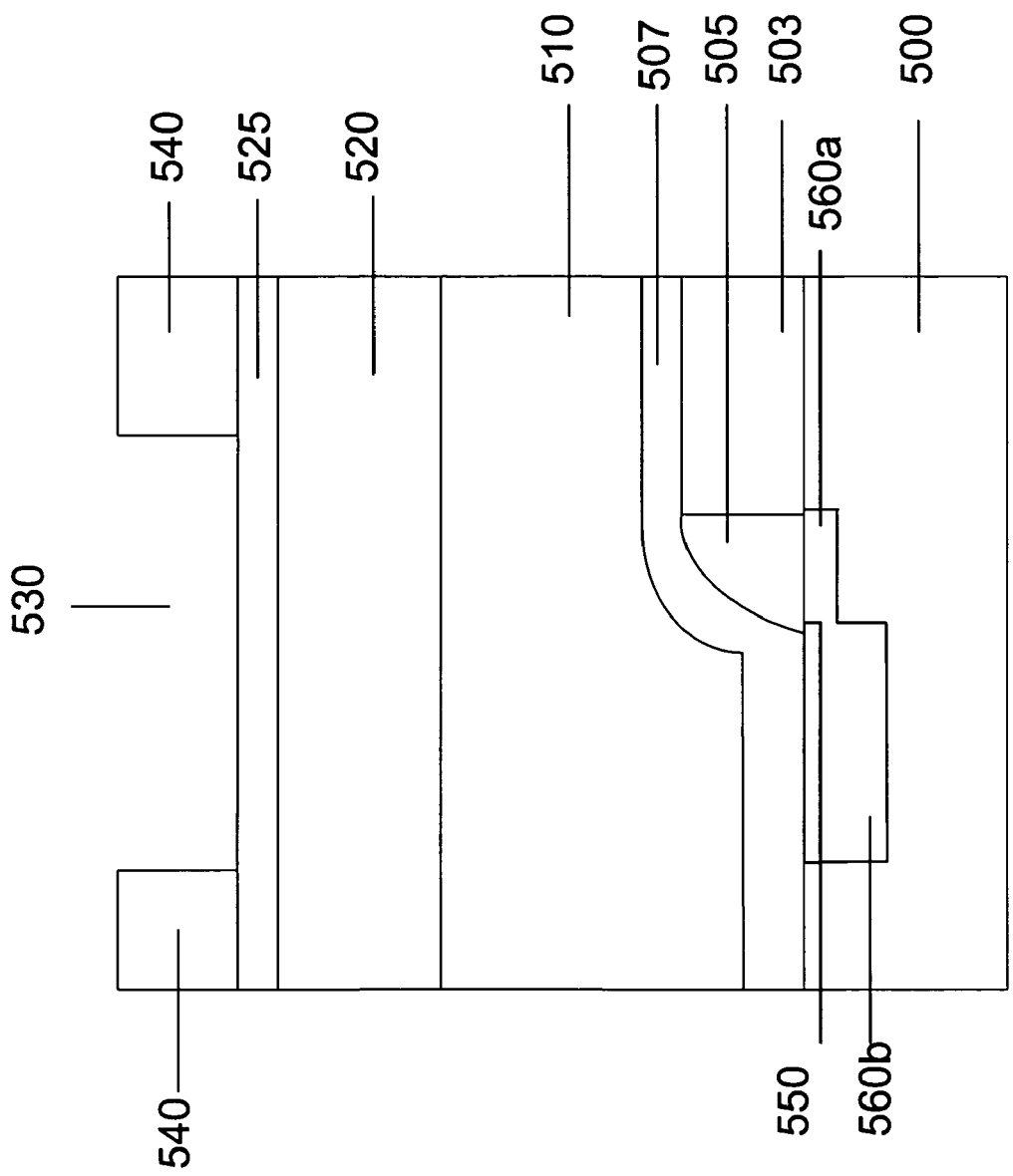

Except for the dielectric layer 507, items of the structure in FIG. 5C which are the same as items of the structure in FIG. 5A are identified by like reference numerals. The dielectric layer 507 is formed below the substantially silicon-free material layer 510, covering the gate 503 and the spacer 505. The dielectric layer 507 can be a material such as silicon nitride, silicon oxy-nitride, silicon carbide, silicon oxy-carbide, silicon fluorine, silicon oxy-fluorine and the like, and can be formed by, for example, CVD. The dielectric layer 507 serves to protect the device composed of the gate 503 and the spacer 505. After the step of removing a portion of the substantially silicon-free material layer 510, a portion of the dielectric layer 507 is removed. The portion of the dielectric layer 507 can be removed, for example, by a dry etch process with a mixture of $CHF_3$, $CF_4$ and $O_2$. The formation of the dielectric layer 507 is not necessarily required. It depends on the desired performance of the device composed of the gate 503 and the spacer 505. After viewing the description of this embodiment, one of ordinary skill in the art will understand and readily determine whether to form the dielectric layer 507 for enhancing the performance of the device.

Figure 5D:
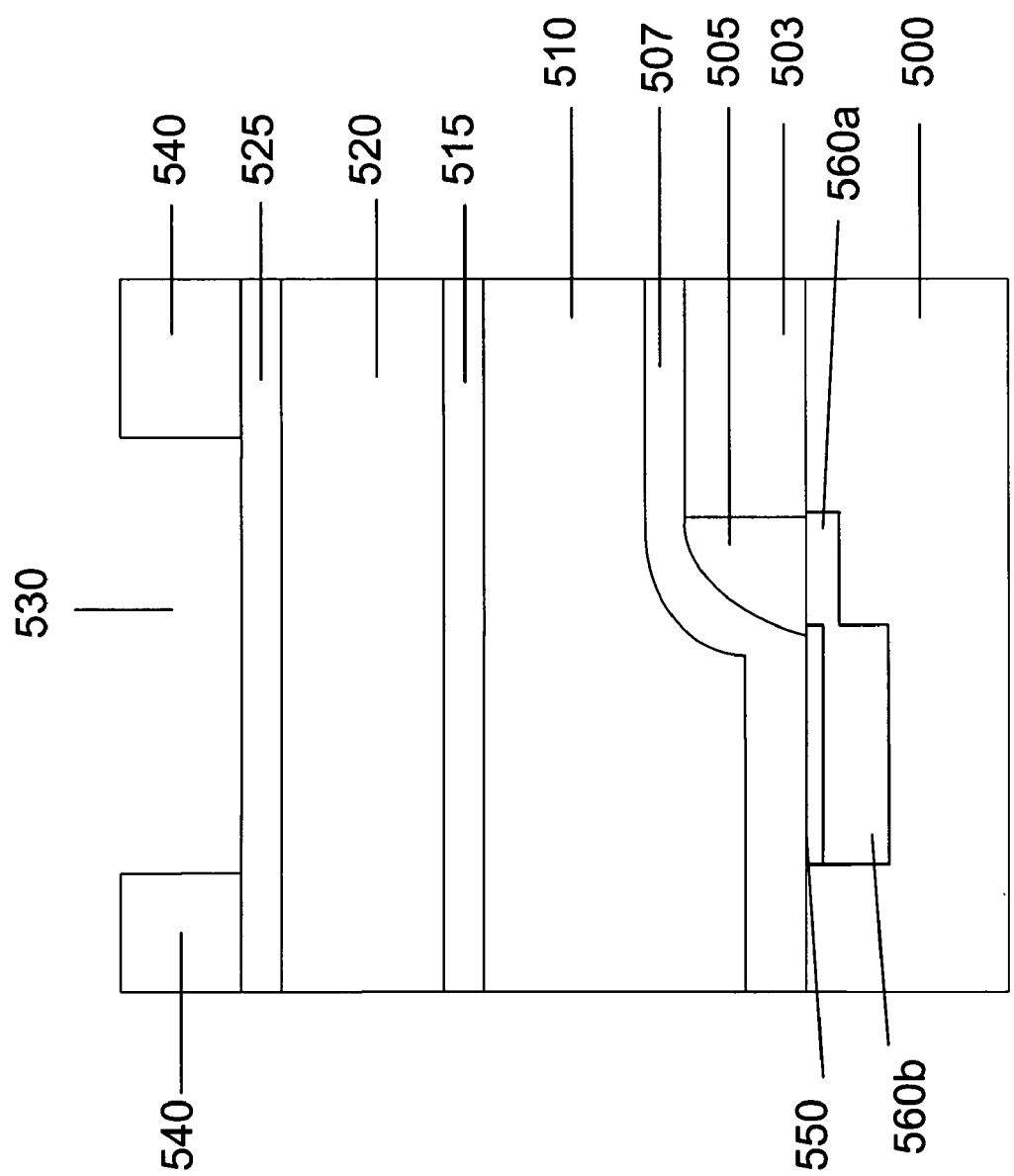

Except for the dielectric layers 507 and 515, items of the structure in FIG. 5D which are the same as items of the structure in FIG. 5A are identified by like reference numerals. The dielectric layer 507 is formed below the substantially silicon-free material layer 510, covering the gate 503 and the spacer 505. The dielectric layer 515 is formed between the material layer 520 and the substantially silicon-free material layer 510. The dielectric layers 507 and 515 are similar to the dielectric layer 507 described in FIG. 5C and the dielectric layer 515 described in FIG. 5B, respectively. Detailed descriptions are not repeated. According to this embodiment, etching processes for removing portions of the dielectric layers 507 and 515 are required. These etching processes are described above with reference to FIGS. 5B and 5C. Detailed descriptions are not repeated. On the basis of process requirements and desired device performance, one of ordinary skill in the art will understand whether the dielectric layers 507 and 515 should be applied to any given situation.

Figure 5E:
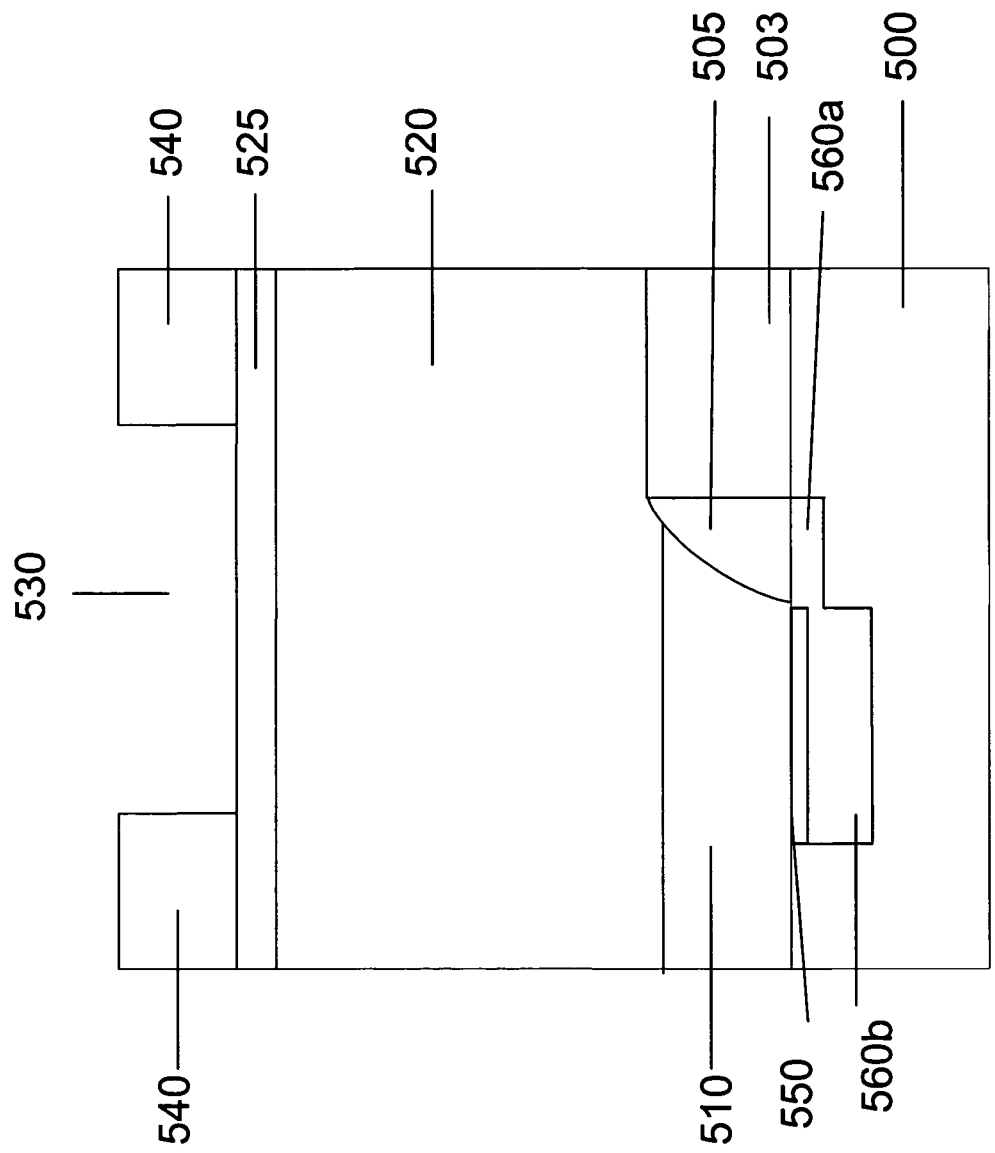

Referring to FIG. 5E, items of the structure in FIG. 5D which are the same as items of the structure in FIG. 5A are identified by like reference numerals. In this embodiment, the substantially silicon-free material layer 510 forms on the spacer 505 without covering the gate 503. As described in FIGS. 3A-3C, as long as the thickness of the substantially silicon-free material layer 510 is sufficient so that the step of removing the portion of the material layer 520 does not substantially damage the S/D salicidation region 550 and the spacer 505, the substantially silicon-free material layer 510 need not fully cover the topographic structure, i.e. the gate 503 and the spacer 505. After reading the description of this exemplary embodiment, one of ordinary skill in the art will understand how to modify the thickness of the substantially silicon-free material layer 510.

Figure 5F:
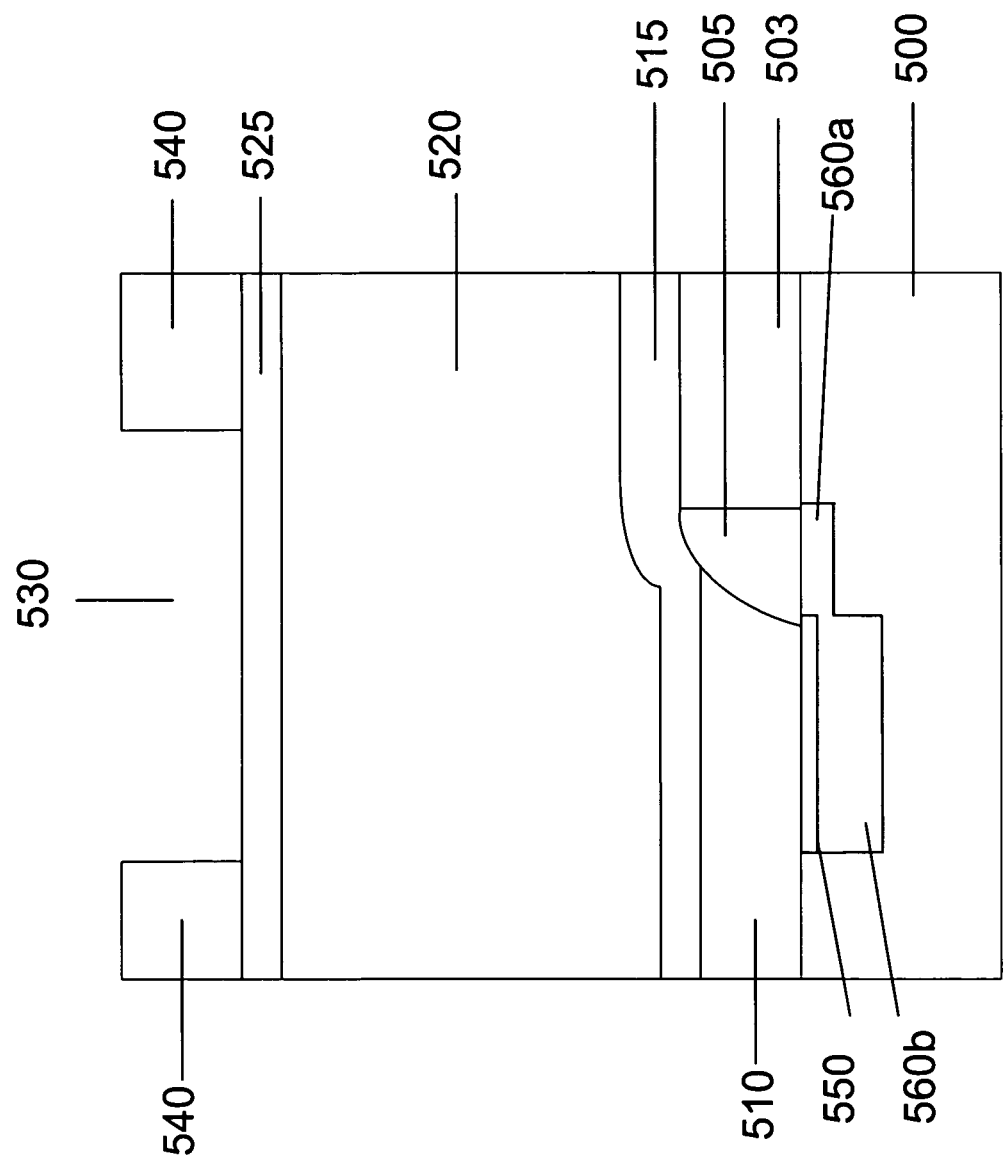

Referring to FIG. 5F, except for the dielectric layer 515, items of the structure in FIG. 5F which are the same as items of the structure in FIG. 5D are identified by like reference numerals. The dielectric layer 515 forms over the substantially silicon-free material layer 510, covering the gate 503 and the spacer 505. In this embodiment, the dielectric layer 515 serves as an etch stop layer as well as a protection layer for the device composed of the gate 503 and the spacer 505. The dielectric layer 515 is similar to that with the same reference numeral described in FIG. 5B. Detailed descriptions are not repeated. After the step of removing the portion of the dielectric layer 520, a portion of the dielectric layer 515 is removed. The portion of the dielectric layer 515 can be removed, for example, by a dry etch process with a mixture of $CHF_3$, $CF_4$ and $O_2$. The portion of the dielectric layer 515 may be removed while the dielectric layer 520 is removed. After reading the description of this embodiment, one of ordinary skill in the art will understand that the etch process for removing the portion of the dielectric layer 515 is flexible and modifiable.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a structure, comprising:
    forming a gate over a silicon substrate and a source/drain (S/D) region within the silicon substrate;
    forming a substantially silicon-free material layer overlying the S/D region, wherein the substantially silicon-free material layer comprises an amorphous carbon low-k dielectric layer that is horizontally spaced from, and not covering, the gate;
    thereafter, forming a second material layer over the substantially silicon-free material layer; and
    thereafter, forming at least one contact hole through the substantially silicon-free material layer and the second material layer thereby exposing the silicon substrate, without substantially damaging the silicon substrate, by using an etch process that does not substantially etch silicon.

2. The method for forming a structure of claim 1 further comprising forming a spacer on a sidewall of the gate, wherein the substantially silicon-free material layer overlies the spacer.

3. The method for forming a structure of claim 1, wherein the substantially silicon-free material layer is thinner than the gate.

4. The method for forming a structure of claim 1, further comprising forming a further dielectric layer under the substantially silicon-free material layer.

5. The method for forming a structure of claim 4, further comprising forming an additional dielectric layer between the substantially silicon-free material layer and the second material layer.

6. The method for forming a structure of claim 1, wherein the step of forming the second material layer comprises forming one or more dielectric layers and one or more anti-reflection coating layers.

7. The method for forming a structure of claim 1, wherein the step of forming the contact hole comprises:
    removing a portion of the second material layer; and
    removing a portion of the substantially silicon-free material layer.

8. The method for forming a structure of claim 7, wherein the step of removing the portion of the second material layer substantially stops when a surface of the substantially silicon-free material layer is reached.

9. The method for forming a structure of claim 7, wherein the step of removing the portion of the substantially silicon-free material layer comprises an etch process having different etch rates for the substantially silicon-free material layer and the second material layer.

10. The method for forming a structure of claim 1, wherein the step of forming the contact does not cause loss of the substrate more than about 200 angstroms.

11. The method of claim 1, further comprising forming a conductive layer in the contact hole.

12. The method for forming a structure of claim 1, wherein the etch process that does not substantially etch silicon comprises a dry etch process with oxygen, nitrogen, hydrogen or a combination thereof; a wet etch process with SPM ($H_2SO_4/H_2$), SOM ($H_2SO_4/O_3$), APM ($NH_4OH/H_2O_2$), liquid $O_3$, super critical $CO_2$ or a combination thereof; or a combination of the dry etch process and the wet etch process.

13. A method for forming a structure, comprising:
    forming a gate over a silicon substrate and a source/drain (S/D) region within the silicon substrate;
    forming a substantially silicon-free material layer overlying the S/D region, wherein the substantially silicon-free material layer comprises a low-k dielectric layer that is horizontally spaced from, and not covering, the gate;
    thereafter, forming a second material layer over the substantially silicon-free material layer; and
    thereafter, forming at least one contact hole through the substantially silicon-free material layer and the second material layer thereby exposing the silicon substrate, without substantially etching the silicon substrate by using an etch process comprising a dry etch process with oxygen, nitrogen, hydrogen or a combination thereof; a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof; or a combination of the dry etch process and the wet etch process.

14. A method for forming a structure, comprising:
    forming a gate over a silicon substrate and a source/drain (S/D) region within the silicon substrate;

forming a substantially silicon-free material layer overlying the S/D region, wherein the substantially silicon-free material layer comprises a low-k dielectric layer that is horizontally spaced from, and not covering, the gate;

thereafter, forming a second material layer over the substantially silicon-free material layer; and thereafter, forming at least one contact hole through the substantially silicon-free material layer and the second material layer thereby exposing the silicon substrate, without substantially damaging the silicon substrate by using a wet etch process with SPM ($H_2SO_4/H_2O_2$), SOM ($H_2SO_4/O_3$), APM ($NH_4OH/H_2O_2$), liquid $O_3$, super critical $CO_2$ or a combination thereof.

* * * * *